United States Patent
Takashima et al.

(10) Patent No.: US 12,439,733 B2
(45) Date of Patent: Oct. 7, 2025

(54) GAP-FILLING METHOD, FILLED-GAP-CONTAINING STRUCTURE, AND METHOD FOR PRODUCING A FILLED-GAP-CONTAINING STRUCTURE

(71) Applicant: NITTO DENKO CORPORATION, Ibaraki (JP)

(72) Inventors: Atsushi Takashima, Ibaraki (JP); Ginji Mizuhara, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 458 days.

(21) Appl. No.: 17/763,965

(22) PCT Filed: Sep. 23, 2020

(86) PCT No.: PCT/JP2020/035854
§ 371 (c)(1),
(2) Date: Mar. 25, 2022

(87) PCT Pub. No.: WO2021/065635
PCT Pub. Date: Apr. 8, 2021

(65) Prior Publication Data
US 2022/0344534 A1    Oct. 27, 2022

(30) Foreign Application Priority Data
Sep. 30, 2019    (JP) .................... 2019-179323

(51) Int. Cl.
*H10H 29/00*    (2025.01)
*H01L 25/075*    (2006.01)
*H10H 20/01*    (2025.01)

(52) U.S. Cl.
CPC ......... *H10H 20/01* (2025.01); *H01L 25/0753* (2013.01)

(58) Field of Classification Search
CPC ... H01L 33/0095; H01L 33/52; H01L 25/073; H01L 25/13; H10H 29/20; H10H 29/85; H10H 29/8506; H10H 29/8508
See application file for complete search history.

(56) References Cited

U.S. PATENT DOCUMENTS 6,683,665 B1    1/2004    Matthies
7,118,803 B1 *  10/2006    Yaguchi .................. C09K 3/10
                                                       428/368

(Continued)

FOREIGN PATENT DOCUMENTS

CN    101287314 A    10/2008
CN    102522420 A    6/2012

(Continued)

OTHER PUBLICATIONS

Decision of Refusal issued on Mar. 19, 2024 for corresponding Japanese Patent Application No. 2019-179323, along with an English machine translation (7 pages).

(Continued)

*Primary Examiner* — Reema Patel
(74) *Attorney, Agent, or Firm* — Hauptman Ham, LLP

(57) ABSTRACT

The present invention provides a gap-filling method whereby a structure having a gap can be appropriately inhibited from being adversely affected by edges of the gap. The present invention relates to a gap-filling method including filling a gap of a structure having the gap therein by inserting a threadlike adhesive body into and along the gap, wherein the threadlike adhesive body is inserted into the gap so as to come into contact with at least some of inner surfaces of the gap and with edges of the gap.

20 Claims, 8 Drawing Sheets

(56) References Cited

U.S. PATENT DOCUMENTS

| | | |
|---|---|---|
| 2001/0028420 A1 | 10/2001 | Suzuki |
| 2002/0001051 A1 | 1/2002 | Krusius et al. |
| 2002/0096994 A1 | 7/2002 | Iwafuchi et al. |
| 2004/0112983 A1 | 6/2004 | Saidman et al. |
| 2004/0115849 A1 | 6/2004 | Iwafuchi et al. |
| 2006/0007059 A1 | 1/2006 | Bell |
| 2007/0087644 A1 | 4/2007 | Iwafuchi et al. |
| 2008/0252839 A1 | 10/2008 | Nakadaira |
| 2009/0103292 A1 | 4/2009 | Iwafuchi et al. |
| 2010/0259296 A1 | 10/2010 | Or-Bach |
| 2010/0289064 A1 | 11/2010 | Or-Bach et al. |
| 2010/0291749 A1 | 11/2010 | Or-Bach et al. |
| 2010/0295136 A1 | 11/2010 | Or-Bach et al. |
| 2011/0049577 A1 | 3/2011 | Or-Bach et al. |
| 2011/0084314 A1 | 4/2011 | Or-Bach et al. |
| 2011/0199116 A1 | 8/2011 | Or-Bach et al. |
| 2013/0135830 A1 | 5/2013 | Lai et al. |
| 2014/0008693 A1 | 1/2014 | Feng |
| 2016/0079211 A1 | 3/2016 | Konishi et al. |
| 2017/0084530 A1* | 3/2017 | Lin .................. H01L 23/564 |
| 2018/0265750 A1 | 9/2018 | Akamatsu et al. |
| 2019/0281705 A1 | 9/2019 | Hanya |
| 2020/0043401 A1* | 2/2020 | Yokoyama ............... G09G 3/32 |
| 2021/0009864 A1 | 1/2021 | Takashima et al. |

FOREIGN PATENT DOCUMENTS

| | | |
|---|---|---|
| CN | 110248466 A | 9/2019 |
| JP | S52-39654 B1 | 10/1977 |
| JP | S54-161650 A | 12/1979 |
| JP | S55-20891 A | 2/1980 |
| JP | 2001-249331 A | 9/2001 |
| JP | 2002-261335 A | 9/2002 |
| JP | 3185994 U | 9/2013 |
| JP | 2019-12162 A | 1/2019 |
| SE | 361083 B | 10/1973 |
| TW | 201814883 A | 4/2018 |
| WO | 2014/192449 A1 | 12/2014 |
| WO | 2017/064925 A1 | 4/2017 |
| WO | 2019/163788 A1 | 8/2019 |

OTHER PUBLICATIONS

International Search Report issued on Dec. 8, 2020, for corresponding International Patent Application No. PCT/JP2020/035854, along with an English translation.

Written Opinion issued on Dec. 8, 2020, for corresponding International Patent Application No. PCT/JP2020/035854.

Royal Museum Greenwich: "HMS Victory caulking material", UK, Jul. 1, 1823, URL:https://www.reddit.com/r/ArtefactPorn/comments/qkgtgo/the_lower_gun_deck_of_hms_victory_a_104gun_royal/ and https://www.rmg.co.uk/collections/objects/rmgc-object-63548, 3 pages.

Gep Frederiks, "Caulking and Sealing of Seams", Mar. 1, 1986, URL:https://home.hccnet.nl/s.gerritsen/techniek/breeuw1.htm, with English translation, 18 pages.

Extended European Search Report dated Oct. 12, 2023 in connection with the corresponding European Patent Application No. 20872481.5, 9 pages.

Office Action issued on Nov. 7, 2023 for corresponding Japanese Patent Application No. 2019-179323, along with an English machine translation (8 pages).

Office Action issued on Dec. 8, 2023 for corresponding Taiwanese Patent Application No. 109134199 along with an English translation (10 pages).

"Sponge Strips, Silicone Foam Strips", Creditthree Plastics Co., Ltd., Kevin's Plastic Shop <https://www.creditthree.com.tw/product-detail-265216.html>, retrieved Dec. 7, 2023, along with an English translation, (8 pages).

Office Action dated Mar. 21, 2025 for corresponding Chinese Patent Application No. 202080067716.7, along with an English translation (16 pages).

Office Action dated Mar. 25, 2025 for corresponding Japanese Patent Application No. 2024-093647, along with an English translation (8 pages).

Decision of Refusal issued on Aug. 12, 2025 for corresponding Japanese Patent Application No. 2024-093647, along with an English machine translation (7 pages).

* cited by examiner

GAP-FILLING METHOD, FILLED-GAP-CONTAINING STRUCTURE, AND METHOD FOR PRODUCING A FILLED-GAP-CONTAINING STRUCTURE

CROSS REFERENCE TO RELATED APPLICATION

This application is a National Stage of International Application No. PCT/JP2020/035854, filed on Sep. 23, 2020, which designates the United States and was published in Japan, and which is based upon and claims priority to Japanese Patent Application No. 2019-179323, filed on Sep. 30, 2019 in the Japan Patent Office. All of the aforementioned applications are hereby incorporated by reference in their entireties.

TECHNICAL FIELD

The present invention relates to a gap-filling method, a filled-gap-containing structure, and a method for producing the filled-gap-containing structure.

BACKGROUND ART

In a structure having a gap therein, edges of the gap sometimes exert an adverse influence.

Such adverse influences are explained using, as an example, an LED module assembly to be used in an LED display. The LED module assembly is an assembly obtained by arranging a plurality of LED modules each including a substrate and a plurality of LED chips formed on the substrate. In the LED module assembly, there is a gap of about tens to hundreds of micrometers between the substrates of adjoining LED modules. Irregular light reflection occurs at edges of the gap (i.e., corners each formed by an edge surface and the LED-chip mounting surface of the substrate), and this poses a problem in that the gap is noticeable when the LEDs are in the state of not emitting light, resulting in a decrease in appearance attractiveness.

Patent Document 1 discloses a feature wherein, in order to avoid that problem, the substrates of adjoining LED modules are jointed and a liquid or gel-state resin material containing a black colorant is applied to the surface of the joint to form a light-absorbing layer.

CITATION LIST

Patent Literature

Patent Document 1: International Publication WO 2017/064925

SUMMARY OF INVENTION

Technical Problems

However, the application of a liquid or gel-state resin material to the gap between the substrates of LED modules as in Patent Document 1 is likely to result in dripping or sagging and this may increase the number of steps for the production.

Examples of methods for preventing irregular light reflection at the edges without using a liquid or gel-state resin material include a method in which the gap between substrates is covered with an adhesive tape. In FIG. 1 is shown an enlarged cross-sectional view of the periphery of a gap 2 between substrates 1 in an LED module assembly, in which the gap 2 is covered with an adhesive tape 3. This method has the following problems.

Since each LED module usually includes LED chips disposed on the substrate over an area extending to near the edges of the substrate, the adhesive tape is required to have a considerably reduced width for covering the gap between substrates while avoiding the LED chips. However, such narrow tapes are prone to become twisted and hence have poor handleability, and the method employing such a tape therefore necessitates a considerably larger number of steps. In addition, the areas to which the adhesive tape can be applied are limited to minute portions near edges of the substrates where no LED chips have been mounted. Because of this, it is difficult to ensure an adhesion area and hence an adhesion strength, and the adhesive tape is prone to peel off.

An object of the present invention, which has been contrived under such circumstances, is to provide a gap-filling method whereby a structure having a gap can be appropriately inhibited from being adversely affected by edges of the gap.

Another object of the present invention is to provide a filled-gap-containing structure which is appropriately inhibited from being adversely affected by edges of the gap and a method for producing the filled-gap-containing structure.

Solution to the Problems

The gap-filling method of the present invention, which solves the problems described above, is a gap-filling method including filling a gap of a structure having the gap therein by inserting a threadlike adhesive body into and along the gap, wherein the threadlike adhesive body is inserted into the gap so as to come into contact with at least some of inner surfaces of the gap and with edges of the gap.

In one embodiment of the gap-filling method of the present invention, the structure has surfaces between which the gap lies and which have been completely separated from each other by the gap, and the threadlike adhesive body may be inserted into the gap so as to come into contact also with at least some of the surfaces between which the gap lies.

In one embodiment of the gap-filling method of the present invention, the structure has a surface in which the gap lies and which has not been completely separated by the gap, and the threadlike adhesive body may be inserted into the gap so as to come into contact also with at least some of the surface in which the gap lies.

In one embodiment of the gap-filling method of the present invention, the threadlike adhesive body may be inserted into the gap while being deformed.

In one embodiment of the gap-filling method of the present invention, the threadlike adhesive body, before being inserted into the gap, may have a diameter which is 0.6 to 4 times a width of the gap.

In one embodiment of the gap-filling method of the present invention, the threadlike adhesive body, when compressed at 25° C. in a thickness direction under a load of 500 g per 5-cm length, may have a degree of deformation of 5-90%.

In one embodiment of the gap-filling method of the present invention, the threadlike adhesive body, when stretched at 25° C. to 10% strain, may have a tensile stress of 0.02-10 N.

In one embodiment of the gap-filling method of the present invention, the threadlike adhesive body may have a 20% elongation recovery at 25° C. of 20% or higher.

In one embodiment of the gap-filling method of the present invention, the structure is an LED module assembly including a plurality of LED modules disposed in an arrangement, the LED modules each including a substrate and a plurality of LED chips disposed thereon, and the gap may be a gap lying between the substrates of adjoining LED modules of the LED module assembly.

In one embodiment of the gap-filling method of the present invention, the threadlike adhesive body may be black.

The filled-gap-containing structure of the present invention, which solves the problems described above, is a filled-gap-containing structure including a structure having a gap therein and a threadlike adhesive body which has been inserted into the gap to fill the gap along thereof, wherein the threadlike adhesive body is in contact with at least some of inner surfaces of the gap and with edges of the gap.

In one embodiment of the filled-gap-containing structure of the present invention, the structure has surfaces between which the gap lies and which have been completely separated from each other by the gap, and the threadlike adhesive body may be in contact also with at least some of the surfaces between which the gap lies.

In one embodiment of the filled-gap-containing structure of the present invention, the structure has a surface in which the gap lies and which has not been completely separated by the gap, and the threadlike adhesive body may be in contact also with at least some of the surface in which the gap lies.

In one embodiment of the filled-gap-containing structure of the present invention, the threadlike adhesive body, before having been inserted into the gap, may have had a diameter which was 0.6 to 4 times a width of the gap.

In one embodiment of the filled-gap-containing structure of the present invention, the threadlike adhesive body, when compressed at 25° C. in a thickness direction under a load of 500 g per 5-cm length, may have a degree of deformation of 5-90%.

In one embodiment of the filled-gap-containing structure of the present invention, the threadlike adhesive body, when stretched at 25° C. to 10% strain, may have a tensile stress of 0.02-10 N.

In one embodiment of the filled-gap-containing structure of the present invention, the threadlike adhesive body may have a 20% elongation recovery at 25° C. of 20% or higher.

In one embodiment of the filled-gap-containing structure of the present invention, the structure is an LED module assembly including a plurality of LED modules disposed in an arrangement, the LED modules each including a substrate and a plurality of LED chips disposed thereon, and the gap may be a gap lying between the substrates of adjoining LED modules of the LED module assembly.

In one embodiment of the filled-gap-containing structure of the present invention, the threadlike adhesive body may be black.

The method of the present invention for producing a filled-gap-containing structure, which solves the problems described above, includes filling a gap of a structure having the gap therein by inserting a threadlike adhesive body into and along the gap, wherein the threadlike adhesive body is inserted into the gap so as to come into contact with at least some of inner surfaces of the gap and with edges of the gap.

In one embodiment of the method of the present invention for producing a filled-gap-containing structure, the structure has surfaces between which the gap lies and which have been completely separated from each other by the gap, and the threadlike adhesive body may be inserted into the gap so as to come into contact also with at least some of the surfaces between which the gap lies.

In one embodiment of the method of the present invention for producing a filled-gap-containing structure, the structure has a surface in which the gap lies and which has not been completely separated by the gap, and the threadlike adhesive body may be inserted into the gap so as to come into contact also with at least some of the surface in which the gap lies.

In one embodiment of the method of the present invention for producing a filled-gap-containing structure, the threadlike adhesive body may be inserted into the gap while being deformed.

In one embodiment of the method of the present invention for producing a filled-gap-containing structure, the threadlike adhesive body, before being inserted into the gap, may have a diameter which is 0.6 to 4 times a width of the gap.

In one embodiment of the method of the present invention for producing a filled-gap-containing structure, the threadlike adhesive body, when compressed at 25° C. in a thickness direction under a load of 500 g per 5-cm length, may have a degree of deformation of 5-90%.

In one embodiment of the method of the present invention for producing a filled-gap-containing structure, the threadlike adhesive body, when stretched at 25° C. to 10% strain, may have a tensile stress of 0.02-10 N.

In one embodiment of the method of the present invention for producing a filled-gap-containing structure, the threadlike adhesive body may have a 20% elongation recovery at 25° C. of 20% or higher.

In one embodiment of the method of the present invention for producing a filled-gap-containing structure, the structure is an LED module assembly including a plurality of LED modules disposed in an arrangement, the LED modules each including a substrate and a plurality of LED chips disposed thereon, and the gap may be a gap lying between the substrates of adjoining LED modules of the LED module assembly.

In one embodiment of the method of the present invention for producing a filled-gap-containing structure, the threadlike adhesive body may be black.

Advantageous Effects of Invention

The gap-filling method of the present invention can appropriately inhibit a structure having a gap from being adversely affected by edges of the gap.

The filled-gap-containing structure of the present invention is appropriately inhibited from being adversely affected by edges of the gap.

According to the method of the present invention for producing a filled-gap-containing structure, the obtained filled-gap-containing structure is appropriately inhibited from being adversely affected by edges of the gap.

DESCRIPTION OF EMBODIMENTS

Figure 1:
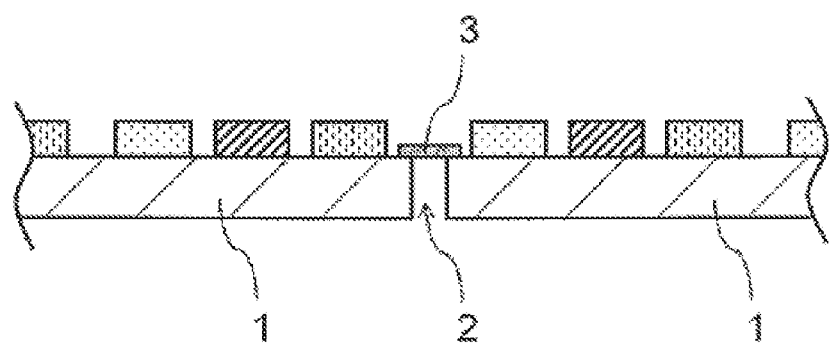
FIG. 1 is an enlarged cross-sectional view of the periphery of a gap in an LED module assembly in which the gap between substrates is covered with an adhesive tape.

Embodiments of the present invention are explained in detail below. The present invention is not limited to the embodiments explained below. In the drawings, members and portions having the same function are sometimes designated by like sings, and duplicates of explanation are sometimes omitted or simplified. The embodiments shown in the drawings have been schematized in order to clearly explain the present invention and do not always precisely show the sizes or scales of actual products.

A gap-filling method according to an embodiment of the present invention is a gap-filling method including filling a gap of a structure having the gap therein by inserting a threadlike adhesive body into and along the gap, wherein the threadlike adhesive body is inserted into the gap so as to come into contact with at least some of inner surfaces of the gap and with edges of the gap.

The structure in which a gap is to be filled by the gap-filling method according to this embodiment and the gap are not particularly limited in the configurations thereof.

The surface(s) of the structure where the gap lies may or may not have been completely separated by the gap. The structure may be constituted of a single member or may be configured of a plurality of members. In the case where the structure is configured of a plurality of members, the gap may be a gap lying between members or may be a gap lying in a surface of any of the members. Configuration examples of a structure and a gap are explained below using FIG. 2A to FIG. 2C, which are schematic views. The configurations of the structure and gap of the present invention are not limited to the configuration examples explained below.

Figure 2A:
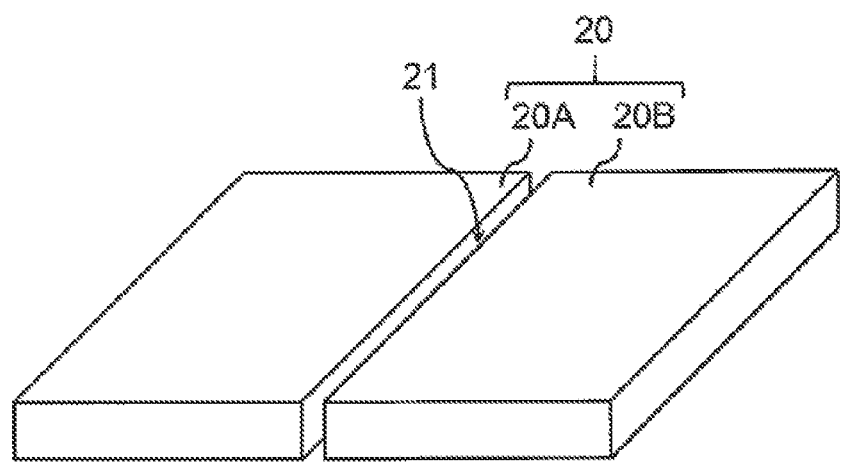
FIG. 2A is a schematic view showing a configuration example of a structure and a gap.

In the configuration example shown in FIG. 2A, the surfaces of the structure 20 where a gap 21 lies have been completely separated from each other by the gap 21. The structure 20 is configured of a plurality of members (a member 20A and a member 20B), and the gap 21 is the gap between the member 20A and the member 20B.

Figure 2B:
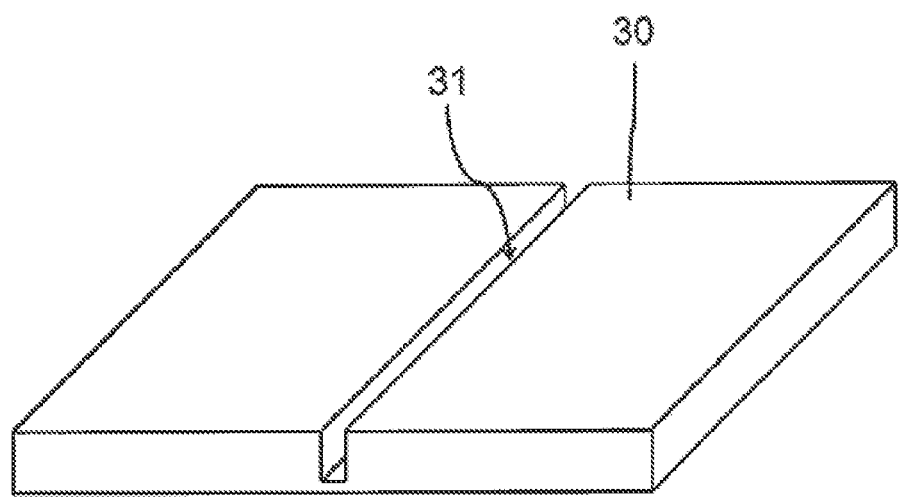
FIG. 2B is a schematic view showing another configuration example of a structure and a gap.

Also in the configuration example shown in FIG. 2B, the surfaces of the structure 30 where a gap 31 lies have been completely separated by the gap 31. In this configuration, however, the structure is constituted of a single member.

Figure 2C:
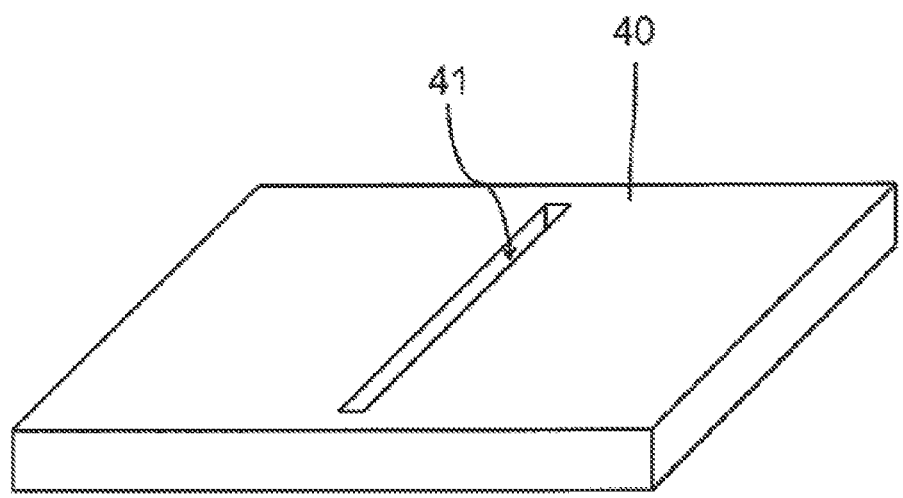
FIG. 2C is a schematic view showing still another configuration example of a structure and a gap.

In the configuration example shown in FIG. 2C, the surface of the structure 40 where a gap lies has not been completely separated by the gap 41.

Figure 3:
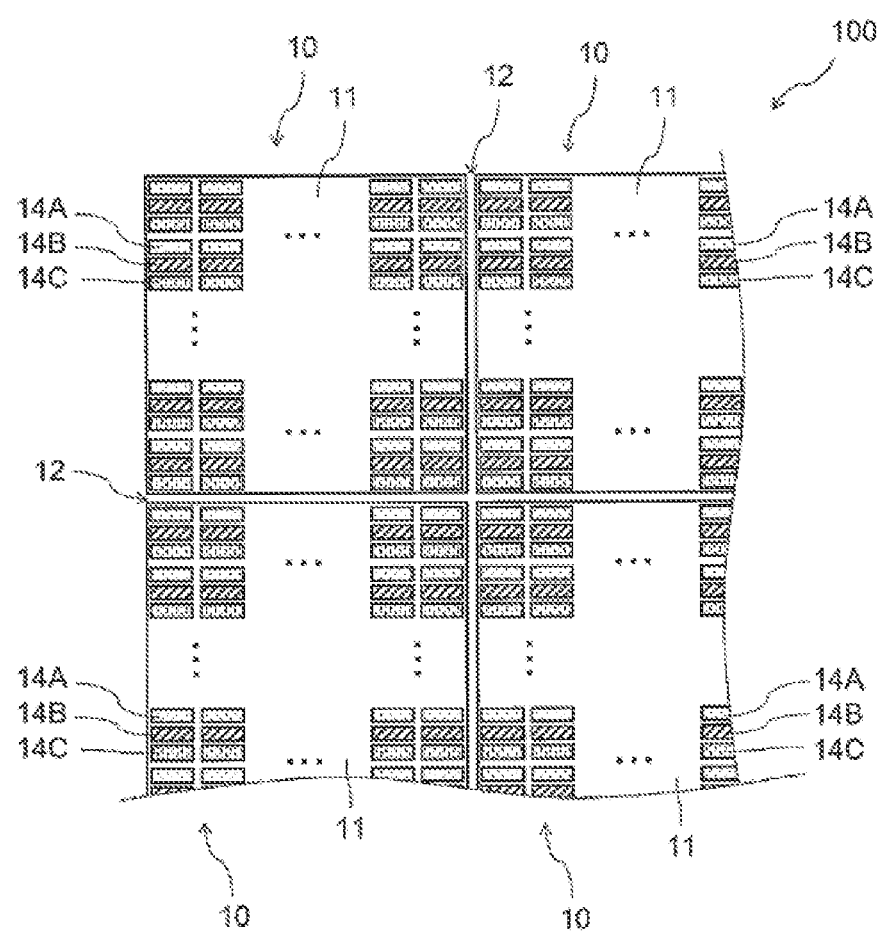
FIG. 3 is a diagrammatic top view of an LED module assembly.
Figure 4:
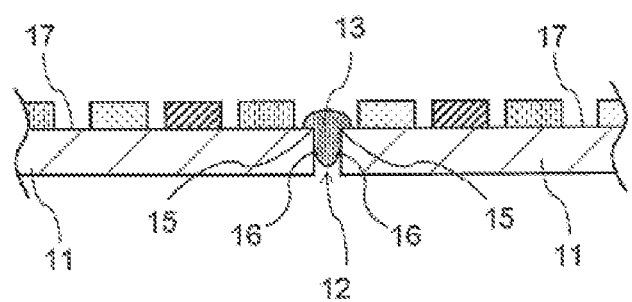
FIG. 4 is an enlarged cross-sectional view of the periphery of a gap in an LED module assembly in which the gap between the substrates of adjoining LED modules has been filled by a gap-filling method according to one embodiment of the present invention.

The gap-filling method according to this embodiment is suitable for use as, for example, a method for filling the gap between the substrates of adjoining LED modules in an LED module assembly. In FIG. 3 is shown a diagrammatic top view of an LED module assembly. In FIG. 4 is shown an enlarged cross-sectional view of the periphery of a gap in an LED module assembly in which the gap between the substrates of adjoining LED modules has been filled by the gap-filling method according to this embodiment.

The LED module assembly 100 is an assembly in which a plurality of LED modules 10 have been disposed in an arrangement. Each LED module 10 includes a substrate 11 and a plurality of LED chips 14A, 14B, and 14C disposed on the substrate 11. In the LED module assembly 100, there are gaps 12 each formed between the substrates 11 of adjoining LED modules 10 as shown in FIG. 3, and irregular light reflection occurring at edges 15 of these gaps pose problems such as that described hereinabove. The gap-filling method according to this embodiment can appropriately diminish the irregular light reflection occurring at the edges. This method is explained in detail below.

In the gap-filling method according to this embodiment, a threadlike adhesive body is inserted into and along a gap to thereby fill the gap. The threadlike adhesive body is an adhesive object which has a thread shape and the peripheral surface of which has adhesive properties. A detailed explanation on the threadlike adhesive body will be given later.

In the gap-filling method according to this embodiment, since a threadlike adhesive body is used for filling a gap, there is no possibility that dripping or sagging might occur as in the case of using a liquid or gel-state material. Furthermore, this method is free from the problem wherein a filling or covering material becomes twisted and has poor handleability as in the case of using a narrow and flat adhesive tape.

In the gap-filling method according to this embodiment, the threadlike adhesive body is inserted into the gap so as to come into contact with at least some of inner surfaces of the gap.

The term "inner surfaces of a gap" in this description means opposed surfaces which form the gap. For example, with respect to a gap 12 lying between the substrates 11 of adjoining LED modules, edge surfaces of the substrates 11 are inner surfaces 16 of the gap, as shown in FIG. 4.

In the gap-filling method according to this embodiment, there is no need of bringing the threadlike adhesive body into contact with the whole inner surfaces of the gap, and the threadlike adhesive body is brought into contact with at least some of the two opposed inner surfaces. By inserting the threadlike adhesive body in this manner, the threadlike adhesive body is caused to adhere to at least some of the inner surfaces of the gap, thereby ensuring an adhesion strength and rendering the threadlike adhesive body less apt to fall off.

In the gap-filling method according to this embodiment, the threadlike adhesive body is inserted into the gap so as to come into contact with edges of the gap. The term "edges of a gap" herein means corners formed by the inner surfaces of the gap and the surfaces where the gap lies (the surfaces separated by the gap). For example, with respect to a gap 12 lying between the substrates 11 of adjoining LED modules 11, the corner between an edge surface 16 and the top surface 17 of each substrate is an edge 15 of the gap. By thus bringing the threadlike adhesive body into contact with the edges of the gap, adverse influences of the edges can be diminished. For example, in LED module assemblies, irregular light reflection occurring at the edges of gaps can be diminished and the gaps can be made less noticeable when the LEDs are in the state of not emitting light.

Figure 5:
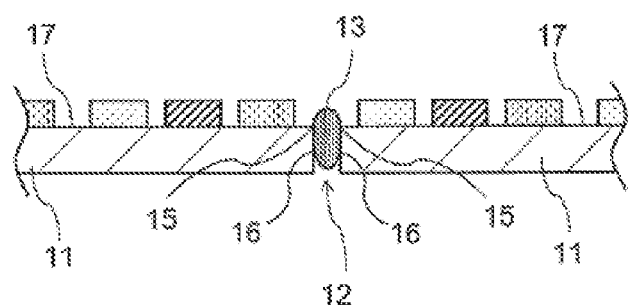
FIG. 5 is an enlarged cross-sectional view of the periphery of a gap in an LED module assembly in which the gap between the substrates of adjoining LED modules has been filled by a gap-filling method according to another embodiment of the present invention.

In FIG. 5 is shown an enlarged cross-sectional view of the periphery of a gap in a modification example of the LED module assembly in which the gap between the substrates of adjoining LED modules has been filled by the gap-filling method according to this embodiment.

In the example shown in FIG. 4, the threadlike adhesive body 13 is only required, in the gap-filling method according to this embodiment, to be inserted so as to come into contact with at least some of the inner surfaces 16 of the gap 12 and with the edges 15. Therefore, although the threadlike adhesive body 13 in the example shown in FIG. 4 is in contact with the surfaces where the gap lies, i.e., the top surfaces 17, it may not be in contact with the surfaces where the gap lies, as in the modification example shown in FIG. 5.

However, from the standpoints of increasing the adhesion area and thereby further improving the adhesion strength and of further lessening the adverse influences of the edges, the threadlike adhesive body is preferably inserted into the gap so as to come into contact with at least some of the surfaces where the gap lies, as in the example shown in FIG. 4.

In the gap-filling method according to this embodiment, methods for inserting the threadlike adhesive body into a gap are not particularly limited. For example, the threadlike adhesive body can be inserted into a gap by placing the threadlike adhesive body over the gap and pushing it into the gap. In this operation, the threadlike adhesive body is preferably inserted into the gap while being deformed.

Meanwhile, it is preferred to elongate the threadlike adhesive body and insert the threadlike adhesive body in the thinned state into a gap, because this facilitates the insertion. This method is preferred also from the standpoint of adhesion strength because the elongated threadlike adhesive body tends to recover the original length and thickness in the gap and, as a result, the peripheral surface of the threadlike adhesive body is pushed against the inner surfaces of the gap and is tenaciously bonded.

Figure 6:
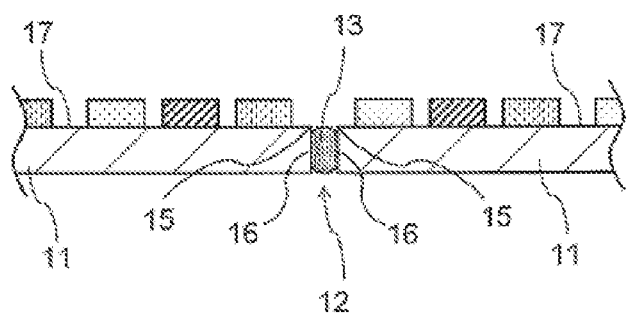
FIG. 6 is an enlarged cross-sectional view of the periphery of a gap in an LED module assembly in which the gap between the substrates of adjoining LED modules has been filled with a threadlike adhesive body, which has been inserted into the gap too deeply.

If the threadlike adhesive body is excessively pushed into a gap when inserted thereinto, this threadlike adhesive body comes to be not in contact with the edges as shown in FIG. 6. Hence, the pressure for pushing the threadlike adhesive body and the degree in which the threadlike adhesive body is to be elongated are regulated in the insertion in accordance with the width of the gap, the thickness, flexibility, etc. of the threadlike adhesive body, etc.

Although the explanations given above were mainly on methods for filling the gap between the substrates of adjoining LED modules, the gap-filling method according to this embodiment is not limited to these. The gap of a structure to which the gap-filling method according to this embodiment is applied may be a gap lying between a plurality of members, such as the gap between the substrates of LED modules, or may be a gap lying in a single member. Examples of the gap lying in a single member include cracks. For example, edges of a crack (gap) formed in a glass plate are sharp and may cause an injury to a person who touches the edges. However, by filling the crack (gap) by the gap-filling method according this embodiment, the edges are made to be in contact with the threadlike adhesive body and, hence, the possibility of causing such injuries can be reduced.

Next, the threadlike adhesive body to be used in the gap-filling method according this embodiment is explained in detail.

The term "threadlike" means a shape which has a longitudinal-direction length that is sufficiently long as compared with a transverse-direction length thereof and in which a cross-section perpendicular to the longitudinal direction has a shape (hereinafter referred to also as "cross-sectional shape") wherein the proportion of the length of the major axis (the longest of axes passing through the center of gravity of the cross-sectional shape) to the length of the minor axis (the shortest of the axes passing through the center of gravity of the cross-sectional shape), (major axis)/(minor axis), is, for example, 200 or less, preferably 100 or less, more preferably 50 or less, still more preferably 10 or less, yet still more preferably 5 or less, especially preferably 3 or less, and further means a state in which the threadlike adhesive body can be bent in various directions and at various angles like a thread.

The threadlike adhesive body in this embodiment has a cross-sectional shape which is typically circular. However, the cross-sectional shape thereof is not limited thereto, and can be any of various shapes including elliptic and polygonal shapes, besides the circular shape.

The length of the threadlike adhesive body in this embodiment may be suitably regulated in accordance with the length of the gap to be filled.

The thickness (diameter) of the threadlike adhesive body in this embodiment which has not been inserted into a gap may also be suitably regulated in accordance with the width of the gap to be filled.

The thickness of the threadlike adhesive body which has not been inserted into a gap (hereinafter also referred to simply as "before-insertion thickness") may be smaller than the width of the gap, so long as the threadlike adhesive body, after having been inserted into the gap, can be in contact with at least some of the inner surfaces of the gap and with the edges of the gap. For example, in the case of inserting the threadlike adhesive body while pressing it with a roller or a finger, the threadlike adhesive body being inserted into the gap is in the state of having been deformed into a shape which has contacted in the height direction (depth direction of the gap) and expanded in the width direction (width direction of the gap). So long as the width-direction dimension of the deformed threadlike adhesive body is larger than the width of the gap, the before-insertion thickness of the threadlike adhesive body may be smaller than the width of the gap. However, in case where the before insertion thickness of the threadlike adhesive body is too small, it is difficult, without considerably deforming the threadlike adhesive body, to bring the threadlike adhesive body into the state of being in contact with at least some of the inner surfaces of the gap and with the edges of the gap. Meanwhile, in case where the before-insertion thickness of the threadlike adhesive body is too large, it is difficult to insert the threadlike adhesive body into the gap without considerably deforming it.

From those standpoints, the before-insertion thickness of the threadlike adhesive body in this embodiment is preferably at least 0.6 times the width of the gap, more preferably at least 0.8 times, still more preferably at least 1.0 time, and is preferably 4 times or less, more preferably 3.5 times or less, still more preferably 3 times or less.

In the case where the gap is not even in width, the before-insertion thickness of the threadlike adhesive body is preferably at least 0.6 times the maximum width of the gap, more preferably at least 0.8 times, still more preferably at least 1.0 time, and is preferably up to 4 times the minimum width of the gap, more preferably up to 3.5 times, still more preferably up to 3 times.

The threadlike adhesive body in this embodiment may include a core material and an adhesive layer constituted of an adhesive and covering the peripheral surface of the core material. Alternatively, the threadlike adhesive body may consist of an adhesive only without including a core material. From the standpoint of reducing a possibility that the threadlike adhesive body might break when inserted into a gap, the threadlike adhesive body preferably includes a core material.

The threadlike adhesive body consisting of an adhesive only can be obtained, for example, by linearly applying the adhesive to a release liner and optionally heating and drying the applied adhesive.

Meanwhile, the threadlike adhesive body including a core material can be obtained, for example, by applying an adhesive composition to the surface of the core material by dipping, immersion, or another application method and optionally heating and drying the applied adhesive composition. The adhesive composition can be applied using a common coater such as, for example, a gravure roll coater, a reverse-roll coater, a kiss-roll coater, a dip roll coater, a bar coater, a knife coater, or a spray coater.

The kind of the adhesive to be used is not particularly limited, and use can be made, for example, of acrylic adhesives, rubber-based adhesives, vinyl-alkyl-ether-based adhesives, silicone-based adhesives, polyester-based adhesives, polyamide-based adhesives, urethane-based adhesives, fluoropolymer-based adhesives, and epoxy-based adhesives. Preferred of these from the standpoint of adhesive property are rubber-based adhesives and acrylic adhesives. Acrylic adhesives are especially preferred. One adhesive may be used alone, or two or more adhesives may be used in combination.

The acrylic adhesives are each an adhesive including, as a main component, a polymer formed from one or more (meth)acrylic acid alkyl esters, as a main ingredient, such as ethyl acrylate, butyl acrylate, 2-ethylhexyl acrylate, isooctyl acrylate, and isononyl acrylate and one or more modifying monomers added thereto according to need, such as acrylonitrile, vinyl acetate, styrene, methyl methacrylate, acrylic acid, maleic anhydride, vinylpyrrolidone, glycidyl methacrylate, dimethylaminoethyl methacrylate, hydroxyethyl acrylate, and acrylamide.

The rubber-based adhesives are each an adhesive including, as a main component, a rubbery polymer such as natural rubber, a styrene/isoprene/styrene block copolymer, a styrene/butadiene/styrene block copolymer, a styrene/ethylene-butylene/styrene block copolymer, a styrene/butadiene rubber, polybutadiene, polyisoprene, polyisobutylene, a butyl rubber, a chloroprene rubber, or a silicone rubber.

Various additives can be suitably incorporated into those adhesives. The additives include tackifier resins such as rosins, terpene resins, styrene resins, aliphatic petroleum resins, aromatic petroleum resins, xylene resins, phenolic resins, coumarone-indene resins, and products of hydrogenation of these resins, crosslinking agents, viscosity regulators (thickeners, etc.), leveling agents, releasability regulators, plasticizers, softeners, fillers, colorants (pigments, dyes, etc.), surfactants, antistatic agents, antiseptics, ageing inhibitors, ultraviolet absorbers, antioxidants, and light stabilizers.

The adhesive to be used can be either a solvent-based adhesive or an aqueous dispersion type adhesive. It is preferred to use an aqueous dispersion type adhesive from the standpoint that this adhesive can be applied at a high speed, is friendly to the environment, and is reduced in the possibility that a solvent might exert influences (swelling, dissolution) on the core material.

In the threadlike adhesive body including a core material, the adhesive is preferably adherent in a large amount to the core material, from the standpoint of adhesive force. Specifically, the amount of the adherent adhesive (weight of the adhesive layer per unit length) is preferably 2 mg/m or larger, more preferably 5 mg/m or larger, still more preferably 8 mg/m or larger. Meanwhile, in case where the amount of the adherent adhesive is too large, application of the adhesive to the core material is required to be conducted multiple times or drying the applied adhesive requires a prolonged time period in a production step, resulting in a low production efficiency. Consequently, the amount of the adherent adhesive is preferably 200 mg/m or less, more preferably 180 mg/m or less, still more preferably 160 mg/m or less.

The core material in the threadlike adhesive body including a core material is not particularly limited in the structure, material, etc. thereof so long as the core material is a threadlike member. The structure, material, etc. thereof may be suitably regulated in accordance with required properties such as strength, weight, hardness, etc.

The core material has a cross-sectional shape which is typically circular. However, the cross-sectional shape thereof can be any of various shapes including elliptic and polygonal shapes, besides the circular shape.

The core material may be a monofilament, which is constituted of a single filament, or a multifilament, which is composed of a plurality of filaments, or may be a spun yarn, a finished yarn which has undergone crimping, bulking, etc. and is generally called a textured yarn, bulky yarn, or stretch yarn, a hollow fiber, a yarn obtained by combining two or more of these, for example, by twisting, or the like.

The thickness of the core material is not particularly limited, and may be suitably regulated, together with the thickness of the adhesive layer, so that the threadlike adhesive body has a suitable thickness according to the width of the gap.

A material for constituting the core material may be suitably selected in accordance with required properties such as strength, weight, and hardness.

Examples of usable materials for the core material include: various polymeric materials including rayon, cupra, acetate, promix, nylon, aramid, vinylon, vinylidene, poly (vinyl chloride), polyesters, acrylics, polyolefins such as polyethylene (PE), polypropylene (PP), ethylene/propylene copolymers, and ethylene/vinyl acetate copolymers, polyesters such as poly(ethylene terephthalate), vinyl chloride resins, vinyl acetate resins, polyimide resins, polyamide resins, fluororesins, polyurethanes, polychlal, and poly(lactic acid); various rubbers including natural rubber and synthetic rubbers including polyurethanes; inorganic materials such as glasses, carbon materials, and metals; natural materials such as cotton and wool; and foamed objects such as foamed polyurethanes and foamed polychloroprene rubbers.

Various additives such as, for example, a filler (an inorganic filler, an organic filler, etc.), an aging inhibitor, an antioxidant, an ultraviolet absorber, an antistatic agent, a lubricant, a plasticizer, and a colorant (a pigment, a dye, etc.) may have been incorporated into the core material according to need. The surface of the core material may have undergone a known or common surface treatment such as, for example, a corona discharge treatment, a plasma treatment, or undercoating.

In the threadlike adhesive body including a core material, the entire peripheral surface of the core material need not be always covered with the adhesive layer, and the peripheral surface thereof may include portions not covered with the adhesive layer so long as the effects of the present invention are produced. The end surfaces of the core material may or may not be covered with an adhesive layer. For example, in the case where the threadlike adhesive body has been cut during production thereof or is cut when used, the end surfaces of the core material cannot be covered with an adhesive layer.

The threadlike adhesive body in this embodiment is easy to insert into gaps when having high flexibility and deformability. However, in case where the flexibility thereof is too high, this threadlike adhesive body has reduced handleability and rather makes the gap filling difficult. There are various indexes to the flexibility of the threadlike adhesive body, and examples thereof include the degree of deformation in compression under a given load and tensile stress at 10% strain.

The threadlike adhesive body in this embodiment, when compressed at 25° C. in a thickness direction under a load of 500 g per 5-cm length, has a degree of deformation of preferably 5% or higher, more preferably 10% or higher, still more preferably 15% or higher, from the standpoint of easy insertion into gaps. Meanwhile, from the standpoint of handleability, the degree of deformation thereof is preferably 90% or less, more preferably 85% or less, still more preferably 80% or less.

The threadlike adhesive body in this embodiment, when stretched at 25° C. to 10% strain, has a tensile stress of preferably 0.02 N or higher, more preferably 0.05 N or higher, still more preferably 0.1 N or higher, from the standpoint of easy insertion into gaps. Meanwhile, from the standpoint of handleability, the tensile stress thereof is preferably 10 N or less, more preferably 5 N or less, still more preferably 1 N or less.

The degree of deformation of the threadlike adhesive body in thickness-direction compression under the given load and the tensile stress thereof at 10% strain can be regulated, for example, by suitably regulating the materials of the threadlike adhesive body (the materials of the core material and adhesive) and the shape, thickness, etc. of the threadlike adhesive body.

The degree of deformation of the threadlike adhesive body in thickness-direction compression under a load of 500 g per 5-cm length can be determined by cutting the threadlike adhesive body into a length of 50 mm, measuring with a microscope the height of a cross-section of the cut sample under no load and of the cut sample sandwiched between 1-mm-thick acrylic plates and compressed by imposing a 500-g load thereon for 10 seconds or longer, and calculating the degree of deformation from the measured values using the following equation.

Degree of deformation [%]={(height under no load)−(height under load)}/(height under no load)×100

The tensile stress of the threadlike adhesive body at 10% strain can be determined by cutting the threadlike adhesive body into a length of 60 mm, setting the cut sample on the chucks of an Autograph so as to result in a length of 10 mm, and performing a tensile test at a speed of 50 mm/sec.

As stated above, the threadlike adhesive body in this embodiment, when elongated to some degree and inserted in the elongated state into a gap, preferably tends to recover the original length in the gap.

From that standpoint, the threadlike adhesive body in this embodiment has a 20% elongation recovery at 25° C. of preferably 20% or higher, more preferably 40% or higher, still more preferably 60% or higher. There is no particular upper limit, and the 20% elongation recovery thereof may be 100%.

The elongation recovery of the threadlike adhesive body can be regulated by suitably regulating the materials, thickness, etc. of the threadlike adhesive body.

The 20% elongation recovery of the threadlike adhesive body can be determined by the following method.

First, the threadlike adhesive body is cut into a length of 150 mm.

Next, an Autograph is set so as to have a chuck-to-chuck distance of 100 mm. The cut threadlike adhesive body is chucked, and the chucked portions of the threadlike adhesive body are marked. That is, two marks are put on the threadlike adhesive body at an interval of 100 mm.

Thereafter, the threadlike adhesive body is stretched at a speed of 50 mm/sec until the chuck-to-chuck distance reaches 120 mm, held for 30 seconds, and then detached from the chucks. The mark-to-mark distance L2 in the threadlike adhesive body is measured after the release from the stretching. The 20% elongation recovery is determined from the thus measured L2, the mark-to-mark distance L0 of the threadlike adhesive body of before the stretching (i.e., 100 mm), and the mark-to-mark distance L1 of the threadlike adhesive body in the stretched state (i.e., 120 mm), using the following equation.

20% elongation recovery [%]={(L1−L2)/(L1−L0)}×100

The threadlike adhesive body in this embodiment may have a color which is suitably selected in accordance with applications. For example, in the case where the gap-filling method according this embodiment is for use in filling the gap between the substrates of adjoining LED modules, the threadlike adhesive body is preferably black especially from the standpoint of making the threadlike adhesive body less noticeable when the LEDs are in the state of not emitting light. In the case of the threadlike adhesive body constituted of an adhesive only, the adhesive may be made black, for example, by adding a colorant. In the case of the threadlike adhesive body including a core material, the adhesive may be made black likewise or the core material may be made black, or both may be made black.

A filled-gap-containing structure according to an embodiment of the present invention is a filled-gap-containing structure including a structure having a gap therein and a threadlike adhesive body which has been inserted into the gap to fill the gap along thereof, wherein the threadlike adhesive body is in contact with at least some of inner surfaces of the gap and with edges of the gap.

A method according to an embodiment of the present invention for producing a filled-gap-containing structure is a method including filling a gap of a structure having the gap therein by inserting a threadlike adhesive body into and along the gap, wherein the threadlike adhesive body is inserted into the gap so as to come into contact with at least some of inner surfaces of the gap and with edges of the gap.

Preferred embodiments of the gap-filling method according to this embodiment and of the method for producing a filled-gap-containing structure according to this embodiment are the same as preferred embodiments explained above with regard to the gap-filling method described above.

While embodiments of the present invention have been explained above with reference to the drawings, the present invention is not limited to the embodiments and can be suitably modified within the technical range of the present invention.

While the invention has been described in detail and with reference to specific embodiments thereof, it will be apparent to one skilled in the art that various changes and modifications can be made therein without departing from the spirit and scope thereof.

REFERENCE SIGNS LIST 1, substrate; 2, gap; 3, adhesive tape; 10, LED module; 11, substrate; 12, gap; 13, threadlike adhesive body; 14A, 14B, 14C, LED chip; 15, edge; 16, inner surface of gap (edge surface of substrate); 17, top surface of substrate; 20, 30, 40, structure; 20A, 20B, member; 21, 31, 41, gap; 100, LED module assembly.

The invention claimed is:

1. A gap-filling method, comprising:
   filling a gap of a structure having the gap therein by inserting a threadlike adhesive body into and along the gap,
   wherein
   in a cross-sectional view, the structure has a first side and a second side different from the first side,
   in the cross-sectional view, the gap is a space between a first surface of the structure and a second surface of the structure opposite to the first surface,
   in the cross-sectional view, the gap has an opening by which the space is exposed to an environment on the first side of the structure,
   in the cross-sectional view, the opening of the gap has a width between a first point and a second point, the first point is located at a first position wherein the first surface of the structure intersects the first side of the structure, and the second point is located at a second position wherein the second surface of the structure intersects the first side of the structure,
   the threadlike adhesive body, before being inserted into the gap, has a diameter which is 1.0 to 4.0 times the width of the opening of the gap, and
   the threadlike adhesive body is inserted into the gap so as to come into contact with at least the first surface of the structure, the second surface of the structure, the first point and the second point.

2. The gap-filling method according to claim 1, wherein the structure has surfaces between which the gap lies and which have been completely separated from each other by the gap, and the threadlike adhesive body is inserted into the gap so as to come into contact also with at least some of the surfaces between which the gap lies.

3. The gap-filling method according to claim 1, wherein the structure has a surface in which the gap lies and which has not been completely separated by the gap, and the threadlike adhesive body is inserted into the gap so as to come into contact also with at least some of the surface in which the gap lies.

4. The gap-filling method according to claim 1, wherein the threadlike adhesive body is inserted into the gap while being deformed.

5. The gap-filling method according to claim 1, wherein the threadlike adhesive body, when compressed at 25° C. in a thickness direction under a load of 500 g per 5-cm length, has a degree of deformation of 5-90%.

6. The gap-filling method according to claim 1, wherein the threadlike adhesive body, when stretched at 25° C. to 10% strain, has a tensile stress of 0.02-10 N.

7. The gap-filling method according to claim 1, wherein the threadlike adhesive body has a 20% elongation recovery at 25° C. of 20% or higher.

8. The gap-filling method according to claim 1, wherein the structure is an LED module assembly including a plurality of LED modules disposed in an arrangement, the LED modules each comprising a substrate and a plurality of LED chips disposed thereon, and the gap is a gap lying between the substrates of adjoining LED modules of the LED module assembly.

9. The gap-filling method according to claim 8, wherein the threadlike adhesive body is black.

10. A method for producing a filled-gap-containing structure, the method comprising:
    filling a gap of a structure having the gap therein by inserting a threadlike adhesive body into and along the gap,
    wherein
    in a cross-sectional view, the structure has a first side and a second side different from the first side,
    in the cross-sectional view, the gap is a space between a first surface of the structure and a second surface of the structure opposite to the first surface,
    in the cross-sectional view, the gap has an opening by which the space is exposed to an environment on the first side of the structure,
    in the cross-sectional view, the opening of the gap has a width between a first point and a second point, the first point is located at a first position wherein the first surface of the structure intersects the first side of the structure, and the second point is located at a second position wherein the second surface of the structure intersects the first side of the structure,
    the threadlike adhesive body, before being inserted into the gap, has a diameter which is 1.0 to 4.0 times the width of the opening of the gap, and
    the threadlike adhesive body is inserted into the gap so as to come into contact with at least the first surface of the structure, the second surface of the structure, the first point and the second point.

11. The method for producing a filled-gap-containing structure according to claim 10, wherein the structure has surfaces between which the gap lies and which have been completely separated from each other by the gap, and the threadlike adhesive body is inserted into the gap so as to come into contact also with at least some of the surfaces between which the gap lies.

12. The method for producing a filled-gap-containing structure according to claim 10, wherein the structure has a surface in which the gap lies and which has not been completely separated by the gap, and the threadlike adhesive body is inserted into the gap so as to come into contact also with at least some of the surface in which the gap lies.

13. The method for producing a filled-gap-containing structure according to claim 10, wherein the threadlike adhesive body is inserted into the gap while being deformed.

14. The method for producing a filled-gap-containing structure according to claim 10, wherein the threadlike adhesive body, when compressed at 25° C. in a thickness direction under a load of 500 g per 5-cm length, has a degree of deformation of 5-90%.

15. The method for producing a filled-gap-containing structure according to claim 10, wherein the threadlike adhesive body, when stretched at 25° C. to 10% strain, has a tensile stress of 0.02-10 N.

16. The method for producing a filled-gap-containing structure according to claim 10, wherein the threadlike adhesive body has a 20% elongation recovery at 25° C. of 20% or higher.

17. The method for producing a filled-gap-containing structure according to claim 10, wherein the structure is an LED module assembly including a plurality of LED modules disposed in an arrangement, the LED modules each comprising a substrate and a plurality of LED chips disposed thereon, and the gap is a gap lying between the substrates of adjoining LED modules of the LED module assembly.

18. The method for producing a filled-gap-containing structure according to claim 17, wherein the threadlike adhesive body is black.

19. The method for producing a filled-gap-containing structure according to claim 10, wherein the diameter of the threadlike adhesive body, before being inserted into the gap, is greater than the width of the gap and 4.0 times the width of the gap or less.

20. The gap-filling method according to claim 1, wherein the diameter of the threadlike adhesive body, before being inserted into the gap, is greater than the width of the gap and 4.0 times the width of the gap or less.

\* \* \* \* \*